United States Patent [19]
Yap et al.

[11] Patent Number: 6,037,791
[45] Date of Patent: Mar. 14, 2000

[54] VISION AIDED DOCKING MECHANISM FOR SEMICONDUCTOR TESTERS

[75] Inventors: Hoon-Yeng Yap, Tempe; John Fava, Phoenix; Kevin Ogurchak, Mesa; Andy Aagaard, Tempe, all of Ariz.

[73] Assignee: Intel Corporation, Santa Clara, Calif.

[21] Appl. No.: 08/905,226

[22] Filed: Aug. 1, 1997

[51] Int. Cl.[7] ......................................................... G01R 1/06
[52] U.S. Cl. ......................... 324/758; 324/754; 324/158.1
[58] Field of Search ................................... 324/758, 757, 324/754, 756, 765, 158.1; 348/141, 142, 139; 356/400, 401

[56] References Cited

U.S. PATENT DOCUMENTS

| | | | |
|---|---|---|---|
| 4,820,975 | 4/1989 | Diggle | 356/400 |
| 5,045,710 | 9/1991 | Linker, Sr. et al. | 250/559.34 |
| 5,479,109 | 12/1995 | Lau et al. | 324/758 |
| 5,804,983 | 9/1998 | Nakajima et al. | 324/758 |

*Primary Examiner*—Josie Ballato
*Assistant Examiner*—Minh Tang
*Attorney, Agent, or Firm*—Blakely, Sokoloff, Taylor & Zafman LLP

[57] ABSTRACT

An integrated circuit tester for a test board which has a visual target. The tester includes a test arm that can be electrically coupled to the test board and a movement mechanism that can move the arm relative to the board. The tester further includes a camera that is mounted to the test arm. The camera provides a visual image of the visual target which is used to align the test arm with the test board.

10 Claims, 3 Drawing Sheets

VISION AIDED DOCKING MECHANISM FOR SEMICONDUCTOR TESTERS

BACKGROUND OF THE INVENTION

1. Field of the Invention

The present invention relates to a tester for testing integrated circuit packages.

2. Description of Related Art

Integrated circuits are typically assembled into individual packages which have a plurality of external contacts. The assembled integrated circuit packages are tested before being shipped from a manufacturing facility to insure that the product meets certain design specifications. Some producers of integrated circuit packages test 100% of their products. The testing of packages therefore becomes a step in the manufacturing process of the integrated circuit. To reduce production cost it is desirable to minimize the amount of time required to test the integrated circuit packages.

FIGS. 1 and 2 show an integrated circuit tester 1 of the prior art. The tester 1 includes a test board 2 which has a test socket 3. The tester 1 may also have an automated assembly (not shown) which can couple an integrated circuit package 4 to the test socket 3. The tester 1 is typically constructed so that an integrated circuit package 4 can be automatically plugged into the socket 3, tested and replaced by another package.

The test board 2 is coupled to a test arm 5 that extends from a test console 6. The console 6 contains electrical circuitry that performs tests on the integrated circuit package 4. An operator is typically located at the console 6 to monitor the electrical testing of packages 4. The test arm 5 has a movement mechanism panel 7 that can be manipulated by the operator to move the arm 5 relative to the test board 2.

As shown in FIG. 3 the test arm 5 typically has a plurality of pins 8 that are pressed into a plurality of corresponding test pads 9 located on the backside of the test board 2 when the arm 5 is coupled to the board 2. The test pads 9 are electrically coupled to the test socket 3 by conductive routing of the test board 2. The pins 8 are coupled to the console 6 by wire harnesses and other circuit boards (not shown) in the arm 5. It has been found that the test board 2 must be periodically replaced to repair sockets 3 that become defective during testing, or to insert a newly designed board 2.

Test boards 2 are replaced by initially moving the test arm 5 and pins 8 away from the pads 9. The board 2 is then replaced and the arm 5 is moved back to couple the pins 8 to the pads 9. Because of tolerances and other factors, the pads 9 of the new test board 2 may not be in the same position relative to the pins 8 as the pads of the old board. The operator must therefore manipulate the test arm 5 through the panel 7 so that the pins 8 are accurately aligned with the pads 9. A misalignment between the pins 8 and pads 9 may produce faulty test results.

It can be difficult to align the pins 8 to the pads 9. Referring to FIG. 1 the movement mechanism 7 is located at the opposite end of the arm 5 from the test board 2. The operator must therefore move the arm 5 and then walk over to the test board 2 to see if the pins 8 and pads 9 are aligned. This process is typically repeated a number of times. Additionally, it is more difficult to determine whether the pins 8 are aligned with the pads 9 when the test arm 5 is separated from the test board 2 by only a very small space. The time required to aligned the pins 8 and pads 9 increases the overall cost of testing and producing the parts. It would therefore be desirable to provide an integrated circuit tester which minimizes the amount of time required to install a test board.

SUMMARY OF THE INVENTION

An integrated circuit tester for a test board which has a visual target. The tester includes a test arm that can be electrically coupled to the test board and a movement mechanism that can move the arm relative to the board. The tester further includes a camera that is mounted to the test arm. The camera provides a visual image of the visual target which is used to align the test arm with the test board.

DETAILED DESCRIPTION OF THE INVENTION

The present invention allows an integrated circuit tester to be modified so that a test arm of the tester can be readily coupled to a test board. The test board has at least one visual target. The tester is modified to have a camera incorporated into the test arm. The camera provides a visual image of the visual target that is used to couple the test arm to the test board. Although a modified version of an existing tester is shown and described, it is to be understood that the present invention can be practiced with a newly designed tester which has the visual alignment features shown and described.

Figure 1:
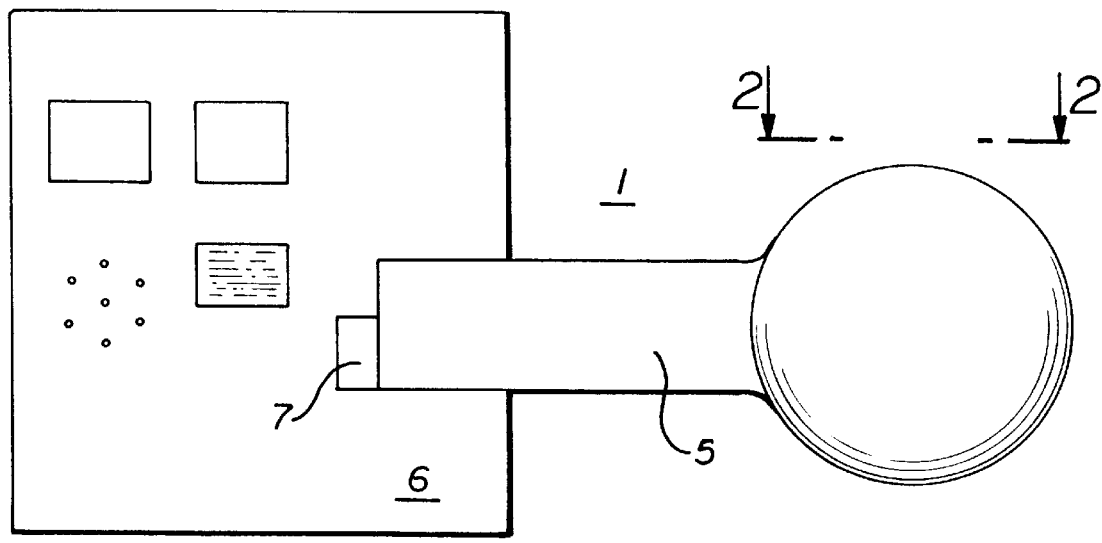
FIG. 1 is a side view of an integrated circuit tester of the prior art.
Figure 2:
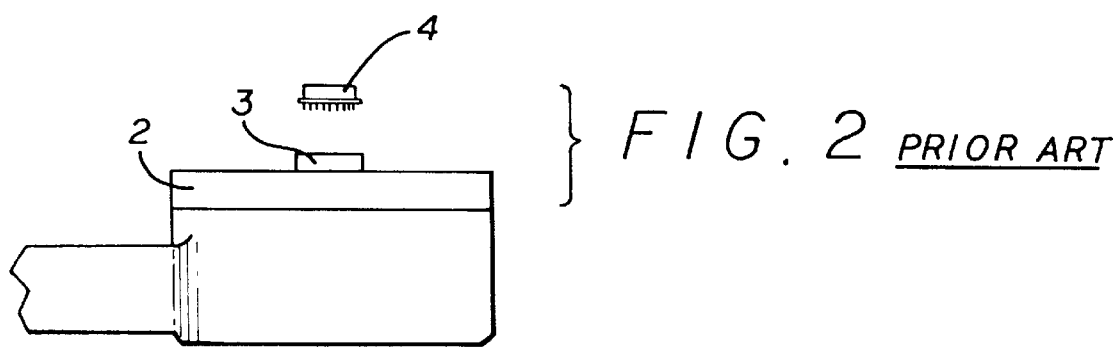
FIG. 2 is a top view of a portion of the tester shown in FIG. 1.
Figure 3:
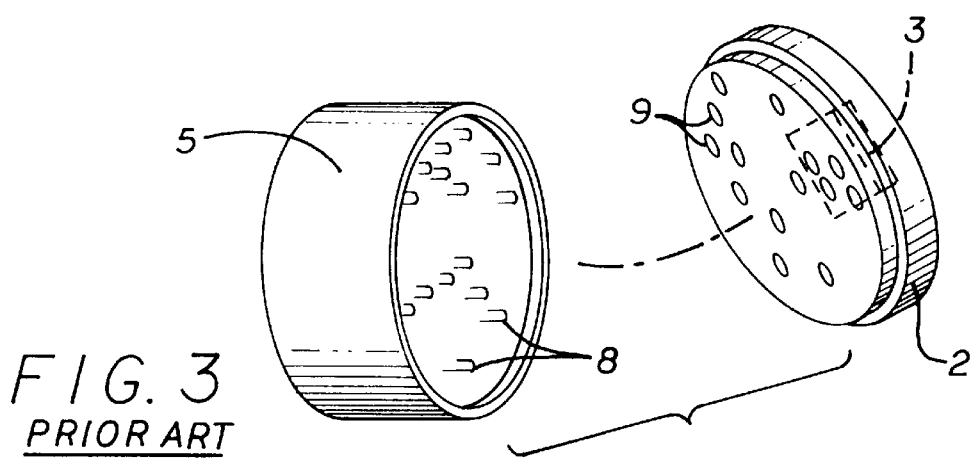
FIG. 3 is an exploded view showing a test arm and a test board of the prior art.
Figure 4:
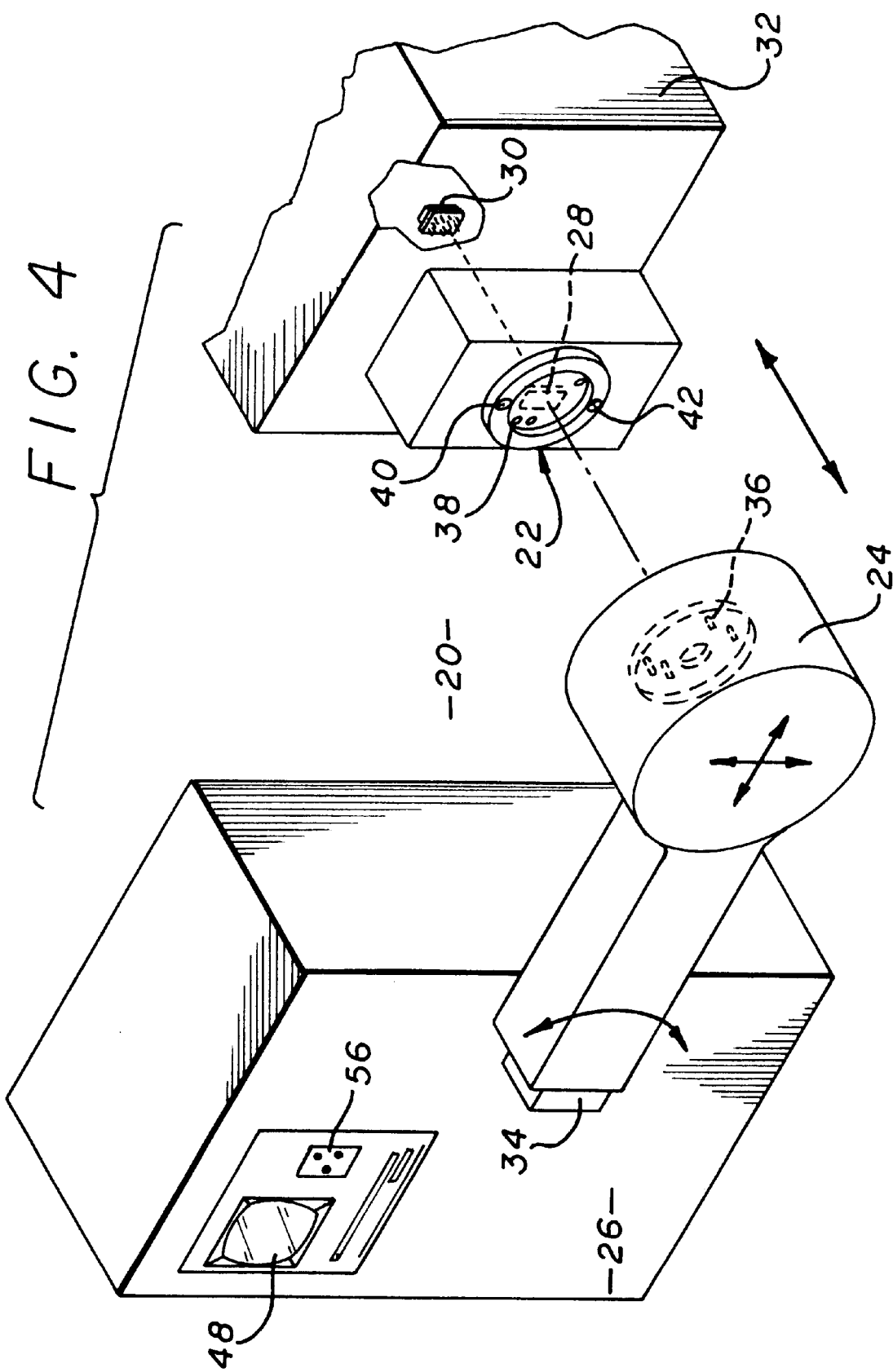
FIG. 4 is a perspective view of an integrated circuit tester of the present invention.

Referring to the drawings more particularly by reference numbers, FIG. 4 shows an integrated circuit tester 20 of the present invention. The tester assembly 20 includes a test board 22 that is coupled to a test arm 24. The test arm 24 extends from a console 26. Located on one side of the test board 22 is a test socket 28. The test socket 28 is constructed so that an integrated circuit package 30 can be plugged into the socket 28. The tester 20 may have an automated loading mechanism 32 which sequentially loads and unloads individual packages 30 into the socket 28.

The socket 28, test board 22 and arm 24 couple the integrated circuit package 30 to the console 26 The console 26 has electrical circuits (not shown) that electrically test the integrated circuit package 30. The test arm 24 has a movement mechanism 34 which moves the arm 24 in a number of different directions. The movement mechanism 34 typically has a plurality of buttons or levers which allow an operator to control the movement of the arm 24. The console 26, unmodified test arm 24 and movement mechanism 34 may be a product produced by Schlumberger as the IX model.

The test arm 24 has a plurality of test pins 36 that are electrically coupled to the console 26 by various wires and circuits (not shown) of the arm 24. The test board 22 has a plurality of corresponding test pads 38 that are electrically connected to the socket 28 by the board 22. The pins 36 are pressed into the pads 38 when the test arm 24 is coupled to the test board 22 to create an electrical connection between the integrated circuit package 30 and the console 26.

The test board 22 has a first visual target 40 and a second visual target 42 that are used to align the pins 36 with the pads 38. Although two targets are shown and described, it is to be understood that any number of targets can be utilized in the present invention.

Figure 5:
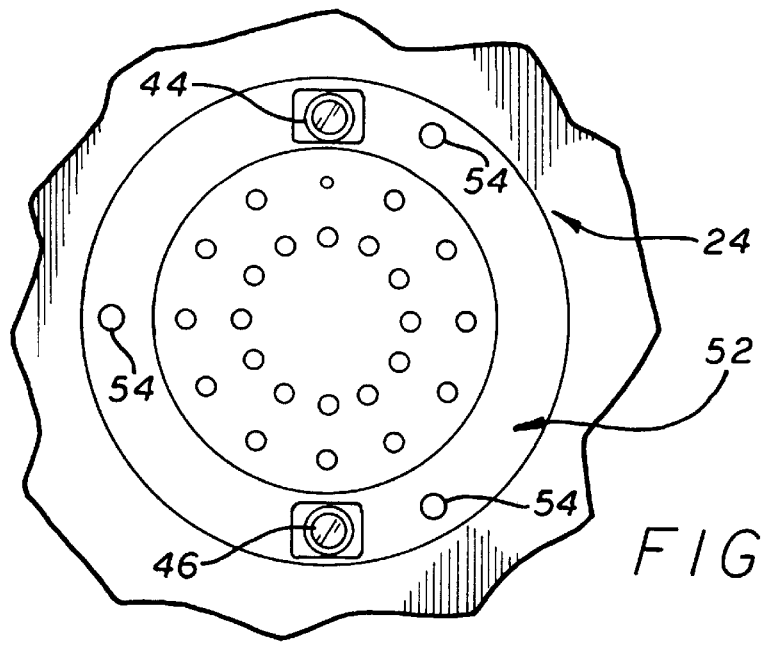
FIG. 5 is a rear view of a test arm of the tester.

As shown in FIG. 5, the test arm 24 has a first camera 44 and a second camera 46. The first camera 44 provides a visual image of the first visual target 40. The second camera 46 provides a visual image of the second visual target 42. The cameras 44 and 46 are coupled to a monitor 48 shown in FIG. 4.

Figure 6:
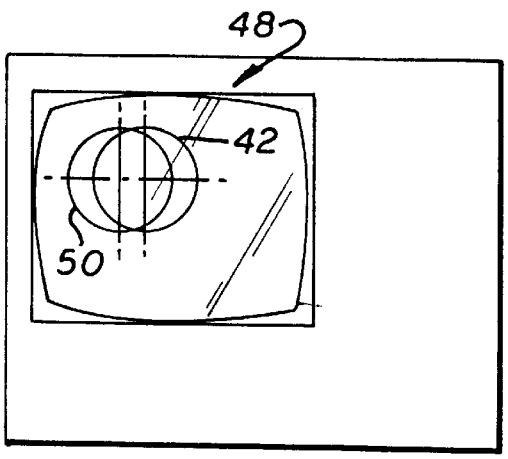
FIG. 6 is a front view of a monitor that displays a visual indicator and a visual target.

As shown in FIG. 6, the monitor 48 displays a visual indicator(s) 50 that can be aligned with one of the visual targets 40 or 42. The visual indicator 50 may be either formed in the screen of the monitor or the lens of each camera 44 and 46. The assembly 20 is constructed so that the pins 36 are aligned with the pads 38 when the indicator(s) 50 is aligned with the visual target(s). The monitor 48 may have either a split screen to provide the operator with a view of both visual targets 40 and 42, or a switch (not shown) that allows the operator to switch between the images of the two different targets 40 and 42. Alternatively, the tester 26 may have two separate monitors 48.

The test arm 24 can be coupled to the test board 22 by moving the arm 24 toward the board 22 with the movement mechanism 34. The operator can determine the alignment of the pins 36 and pads 38 by viewing the monitor 48. The operator does not have to walk over to the test board 22 as was required in the prior art.

The pins 36 are aligned with the pads 38 when the first visual target 40 is aligned with the visual indicator depicted by the first camera 44, and the second visual target 42 is aligned with the visual indicator depicted by the second camera 46. The targets and indicators may be simple reticule designs that are aligned when only one design image appears on the monitor. The relative position of a target and an indicator provides information as to which direction the operator should move the arm 24 to obtain alignment of the pins 36 and pads 38. For example, the image depicted in FIG. 6, shows the indicator 50 to the left of the visual target 42, wherein the operator can readily determine to move the test arm 24 to the right to align the arm 24 with the board 22. As an alternate embodiment, the test arm 24 may have an automatic docking system that utilizes the visual targets to align the arm 24 to the board 22. The arm may include an optical pattern recognition system and a servo control system to implement the automatic docking feature.

The test pins 36 are perpendicular with the test pads 38 when the arm 24 is co-planar with the board 22. It is desirable to have a perpendicular relationship between the test pins 36 and the test pads 38 so that all of the pins 36 are engaged with the pads 38 when the arm 24 is coupled to the board 22. Referring to FIG. 5, the test arm 24 may also have a co-planarity sensor, generally depicted as 52, to determine when the test board 22 is co-planar with the test arm 24.

The co-planarity sensor 52 may include a plurality of equally spaced pressure transducers 54 that are depressed when the arm 24 is coupled to the board 22. The transducers 54 may each includes a spring biased pogo pin that is coupled to a piezoelectric element. The pressure transducers 54 can be coupled to an indicator(s) such as an LED display 56 shown in FIG. 4 which provides a visual indication when the test arm 24 is co-planar with the test board 22. By way of example, the LED display 56 may have three separate LEDs that correspond to the three pressure transducers 54. All three LEDs are illuminated when the test arm 24 is co-planar with the test board 22. If the arm 24 and board 22 are not co-planar then one or more of the LEDs will not be illuminated. The operator can manipulate the test arm 24 until all three LEDs are illuminated.

Figure 7:
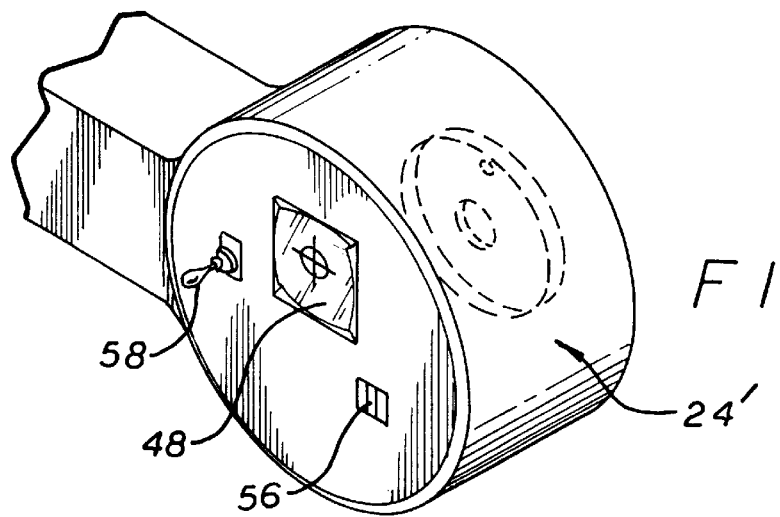
FIG. 7 is a perspective view of an alternate embodiment of the tester.

FIG. 7 shows an alternate embodiment of the tester wherein the monitor 48 and LED display 56 are located at the distal end of the test arm 24'. The tester may also have a joystick 58 which allows the operator to move the arm 24' relative to the test board. With the embodiment of FIG. 7, the operator can readily replace the test board and align the arm 24' without walking back to the console of the tester.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus which is coupled to a test board that has a visual target, comprising:

a test arm that is adapted to be electrically coupled to the test board;

a movement mechanism that moves said tester arm relative to the test board;

a camera that is mounted to said test arm to provide a visual image of the visual target that is used to align said test arm with the test board; and, a co-planarity sensor that is mounted to said test arm and senses when said test arm is co-planar with the test board.

2. The apparatus as recited in claim 1, further comprising a monitor that is coupled to said camera to allow an operator view the visual target.

3. The apparatus as recited in claim 1, wherein said camera has a visual indicator that is aligned with the visual target when said test arm is aligned with the test board.

4. The apparatus as recited in claim 2, wherein said monitor has a visual indicator that is aligned with the visual target when said test arm is aligned with the test board.

5. The apparatus as recited in claim 1, wherein said co-planarity sensor includes a plurality of pressure sensors that are mounted to said test arm.

6. An apparatus, comprising:

a test board which has a test socket located on a first side of said test board and a plurality of test pads that are electrically coupled to said test socket and located on a second opposite side of said test board, said test board further having a first visual target and a second visual target located on said second side of said test board;

a test arm that has a plurality of pins that are electrically coupled to said test pads of said test board;

a movement mechanism that moves said test arm relative to said test board;

a first camera that is mounted to said test arm to provide a visual image of said first visual target of said test board;

a second camera that is mounted to said test arm to provide a visual image of said second visual target of said test board;

a monitor that is coupled to said first and second cameras to allow an operator view said first and second visual targets; and, a co-planarity sensor that is mounted to said test arm and senses when said test arm is co-planar with said test board.

7. The apparatus as recited in claim 6, wherein said first and second cameras each have a visual indicator that is aligned with one of said visual targets when said test arm is aligned with said test board.

8. The apparatus as recited in claim 6, wherein said monitor has a visual indicator that is aligned with one of said visual targets when said test arm is aligned with said test board.

9. The apparatus as recited in claim 6, wherein said co-planarity sensor includes a plurality of pressure sensors that are mounted to said test arm.

10. A method for aligning a test board which has a visual target with a test arm which has a camera, wherein the camera is coupled to a monitor which allows an operator to view the visual target and a visual indicator, comprising:

moving the test arm to align the visual indicator with the visual target and electrically couple the test arm to the test board;

moving the test arm so that the test arm is co-planar with the test board; and, sensing when the test arm is co-planar with the test board.

* * * * *